(12) United States Patent
Fukuro

(10) Patent No.: US 7,309,921 B2  
(45) Date of Patent: Dec. 18, 2007

(54) SEMICONDUCTOR DEVICE

(75) Inventor: Taketo Fukuro, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 155 days.

(21) Appl. No.: 10/760,503

(22) Filed: Jan. 21, 2004

(65) Prior Publication Data

US 2005/0077631 A1    Apr. 14, 2005

(30) Foreign Application Priority Data

Oct. 10, 2003    (JP)    ............................... 2003-352212

(51) Int. Cl.
*H01L 29/06*    (2006.01)
(52) U.S. Cl. ...................... 257/774; 257/653; 257/776; 257/E29.113; 257/E29.327
(58) Field of Classification Search ................ 257/617, 257/652, 651, 341, 353, 342, 649, 650, 776 257/653
See application file for complete search history.

(56) References Cited

U.S. PATENT DOCUMENTS 5,386,138 A    1/1995  Yoshino
5,717,250 A *  2/1998  Schuele et al. ............. 257/754
5,998,837 A * 12/1999  Williams ..................... 257/341
6,294,426 B1 * 9/2001  Tu et al. ..................... 438/255
6,838,692 B1 * 1/2005  Lung ............................. 257/4

FOREIGN PATENT DOCUMENTS

| JP | 52-034674 | 3/1977 |
| JP | 03-022570 | 1/1991 |
| JP | 04-69939 | * 3/1992 |
| JP | 5283715 | 10/1993 |

* cited by examiner

Primary Examiner—Sue A. Purvis  
Assistant Examiner—Fazli Erdem  
(74) Attorney, Agent, or Firm—Volentine & Whitt, P.L.L.C.

(57) ABSTRACT

Leakage current generated in a PN junction diode is reduced, and charge-up current caused by plasma treatment in formation of wiring connected to the PN junction diode is controlled. An $N^+$ region as a first conductive type impurity region provided in a Si substrate with an upper surface being exposed on one main surface of the Si substrate, a $P^+$ polysilicon plug provided with a bottom being contacted with an upper surface of the $N^+$ region, and wiring connected to a top of the $P^+$ polysilicon plug are included.

14 Claims, 5 Drawing Sheets

SEMICONDUCTOR DEVICE

BACKGROUND OF THE INVENTION

1. Field of the Invention

The present invention relates to a semiconductor device, particularly, a semiconductor device having metal wiring connected to a diode having a PN junction.

2. Description of the Related Art

In a conventional semiconductor device, as the diode having the PN junction (hereinafter, referred to as PN junction diode) and metal wiring connected to the PN junction diode, those having the following structures are included.

FIG. 4A shows a section of a schematic structure of the conventional PN junction diode and the metal wiring connected to the PN junction diode.

A $P^+$ region 204 for forming the PN junction is formed in an $N^+$ region 202 formed on a surface of a Si substrate 200. A conductive layer plug 210a is formed on the $P^+$ region 204 and connected to a conductive layer wiring 210b. The conductive layer plug 210a and the conductive layer wiring 210b are formed from a metal such as aluminum, and the conductive layer plug 210a has a structure in which the plug is buried in an insulating film 206 formed to cover a surface of the Si substrate 200.

FIGS. 5A to 5D show a schematic production process of the conventional PN junction diode shown in FIG. 4A.

An N-type impurity is ion-implanted into one main surface of the Si substrate body, thereby the Si substrate 200 as a remaining portion of the body and the $N^+$ region 202 thereon are formed (FIG. 5A). A P-type impurity is ion-implanted into the surface of the $N^+$ region 202, thereby a $P^+$ region 204 is formed (FIG. 5B). In this way, a PN junction 205 is formed in a region where the $N^+$ region 202 is contacted with the $P^+$ region 204.

An insulating film 206 is formed on a surface of the $N^+$ region 202 including the $P^+$ region 204, then an opening 208 for exposing a surface of the $P^+$ region 204 is formed in the insulating film 206 (FIG. 5C). A conductive layer is formed on the insulating film 206 to fill the opening 208 by sputtering, and then a conductive layer plug 210a and a conductive layer wiring 210b are formed by etching patterning (FIG. 5D).

Some diodes having a polysilicon layer provided on a substrate surface are known. For example, in the patent literature 1 (Japanese Patent No. 3,255,698), a diode in which carrier accumulation is prevented by providing the polysilicon layer directly on the PN junction portion and a depletion layer region is proposed. In the patent literature 2 (JP-A-6-350108) a method in which a Zener diode for generating reference voltage and a temperature compensating diode are formed on the same side of a substrate is proposed.

In the conventional PN junction diode shown in FIG. 4A, an area of the junction portion is large and electric current flows in many directions through the junction. FIG. 4B is a perspective view that schematically shows the $P^+$ region 204 in the PN junction diode shown in FIG. 4A. To facilitate the description, the shape is shown as a rectangular prism. Since the PN junction 205 is formed on a bottom 205a and four sides 205b to 205e when the $P^+$ region 204 is assumed to be the rectangular prism, a junction area of the PN junction is large. Moreover, the electric current flows in five directions, that is, a bottom direction I and four side directions II to V as shown by arrows in FIG. 4B. Generally, since the electric current that flows through the circuit increases with increase of the junction area, the large junction area causes increase of leakage current in the PN junction diode.

Thus, the conventional PN junction diode has a drawback of increase of the leakage current because the diode has many current flow paths and a large junction area.

Moreover, in plasma treatment such as sputtering or dry etching process, charge-up current flows along the paths shown by the arrows in FIGS. 4A and 4B as the leakage current. Since surfaces on which the PN junction is formed are the bottom and sides of the $P^+$ region 204, the charge-up current flows in many directions. That is, the charge-up current generated in the plasma treatment such as sputtering in formation of the wiring connected to the PN junction diode flows in many directions, thereby malfunction is apt to occur.

SUMMARY OF THE INVENTION

Therefore, after zealous investigations the inventors have found that an area of forming the PN junction is reduced by forming the PN junction on only one side and the charge-up current can be made to flow one-way.

The semiconductor device of the invention has a feature of having a silicon substrate, a first conductive type impurity region provided in the silicon substrate with an upper surface being exposed on one main surface of the silicon substrate, a second conductive type polysilicon plug provided in contact with the upper surface of the first conductive type impurity region to form the PN junction, and wiring connected to a top of the second conductive type polysilicon plug.

According to the semiconductor device of the invention, the surface for the PN junction is only a bottom of the polysilicon plug, or the PN junction is formed in a contact surface between a diffusion layer in the surface of the silicon wafer and the polysilicon plug having a different conductive type from that of the diffusion layer, thereby flow direction of the electric current can be controlled one-way and the leakage current through the junction can be reduced.

Moreover, the charge-up current caused by the plasma treatment such as sputtering in the formation of the wiring for connection can be controlled by rectification of the PN junction.

DESCRIPTION OF THE PREFERRED EMBODIMENTS

Hereinafter, the best mode for practicing the invention is described with reference to drawings. Respective drawings for describing the production method schematically show sections of structures obtained in respective steps of the production process. Size, shape, and arrangement of each component forming the structures are shown schematically in such a degree that the invention can be briefly understood. Similar components in respective drawings are marked with the same numerals, and an overlapped description of the components may be omitted.

Hereinafter, a case of a PN junction diode in which a $P^+$ polysilicon plug as the second conductive type polysilicon plug provided in contact with the upper surface of the first conductive type impurity region is formed on the $N^+$ region as the first conductive type impurity region provided with the upper surface being exposed on one main surface of a silicon (Si) substrate is described as an example. Accordingly, the N-type corresponds to the first conductive type, and the P-type corresponds to the second conductive type.

Figure 1A:
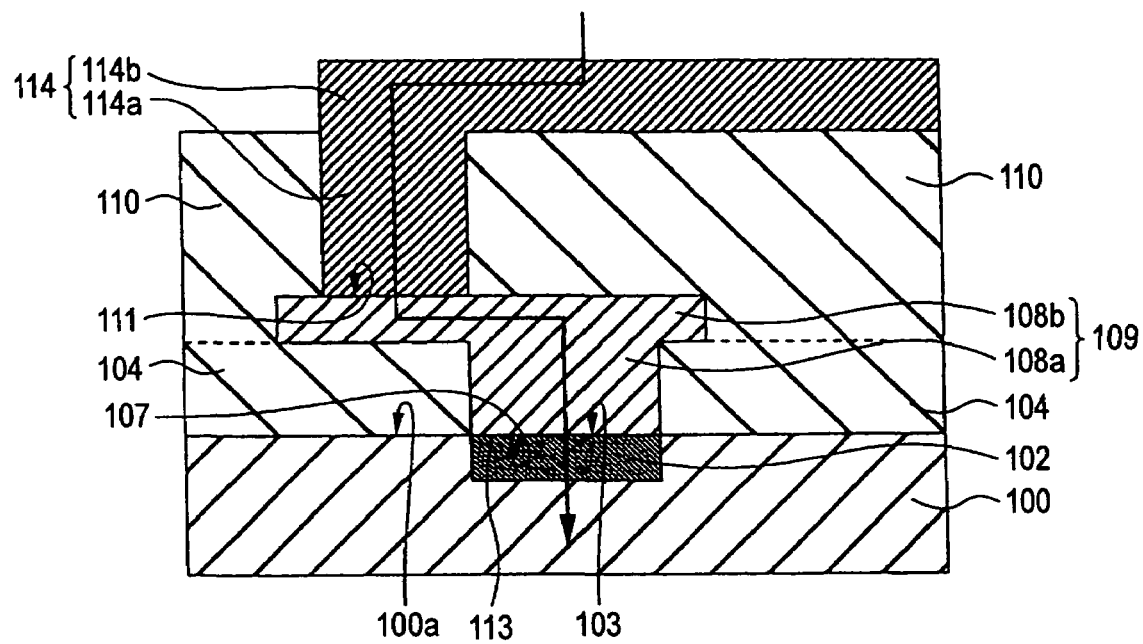
FIGS. 1A and 1B are drawings for describing an example of a configuration of the best mode semiconductor device respectively.

FIG. 1A is a schematic sectional view showing part of the semiconductor device according to the invention.

An $N^+$ region 102 in which an N-type impurity is diffused from a main surface 100a of a Si substrate 100 into the Si substrate 100 is formed. The $N^+$ region 102 is formed with an upper surface 103 being exposed on the main surface 100a of the Si substrate 100. Therefore, in this case, the upper surface 103 of the $N^+$ region 102 is in the same surface as the main surface 10a of the Si substrate 100, or in some cases the upper surface 103 is formed in an upside of the main surface 100a. A $P^+$ polysilicon plug 109 is formed such that it contacts with the upper surface 103 of the $N^+$ region 102. In this best mode, the $P^+$ polysilicon plug 109 comprises a PN junction plug portion 108a and a wiring connection portion 108b formed continuously and integrally with the PN junction plug portion 108a. The PN junction plug portion 108a contacts with the $N^+$ region 102, thereby the PN junction is formed. Thus, the PN junction is formed only in one plane.

The wiring connection portion 108b is connected through a top 111 to a conductive layer plug 114a for making a connection to a conductive layer wiring portion 114b. The $P^+$ polysilicon plug 109 and the conductive layer plug 114a are in a structure that they are buried in an insulating film 104 formed to cover the main surface 100a of the Si substrate 100 and buried in an insulating film 110 formed on the insulating film 104 respectively. A conductive layer as wiring 114 is formed integrally and continuously by the conductive layer plug 114a and the conductive layer wiring 114b (FIG. 1A).

Figure 1B:
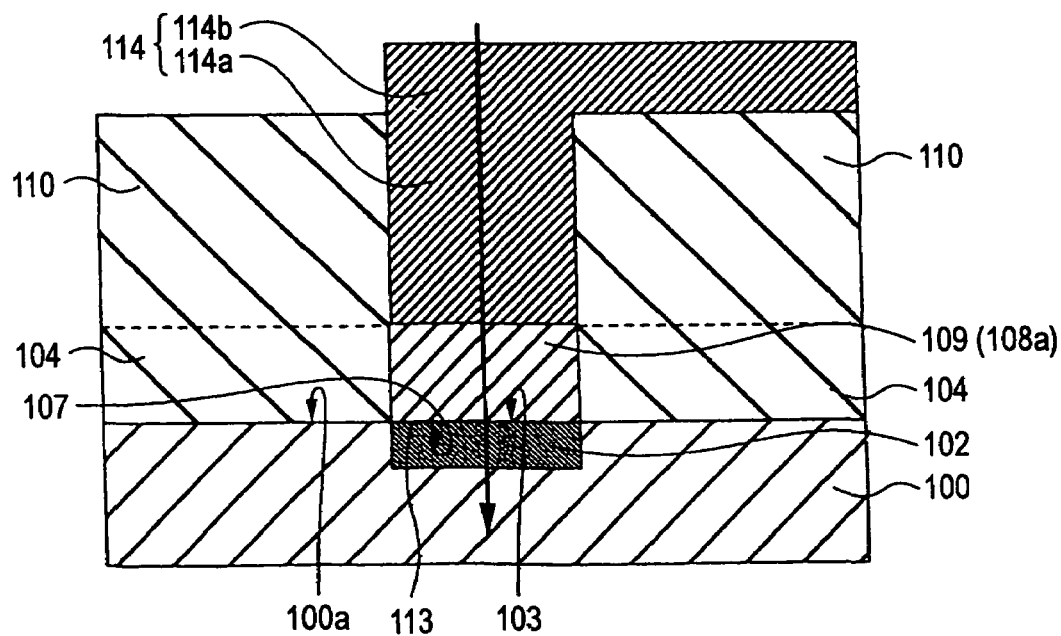

Although the $P^+$ polysilicon plug 109 comprises the PN junction plug portion 108a and the wiring connection portion 108b in the best mode, the conductive plug 114a can be directly connected to the PN junction plug portion 108a without forming the wiring connection portion 108b (FIG. 1B).

Figure 4A:
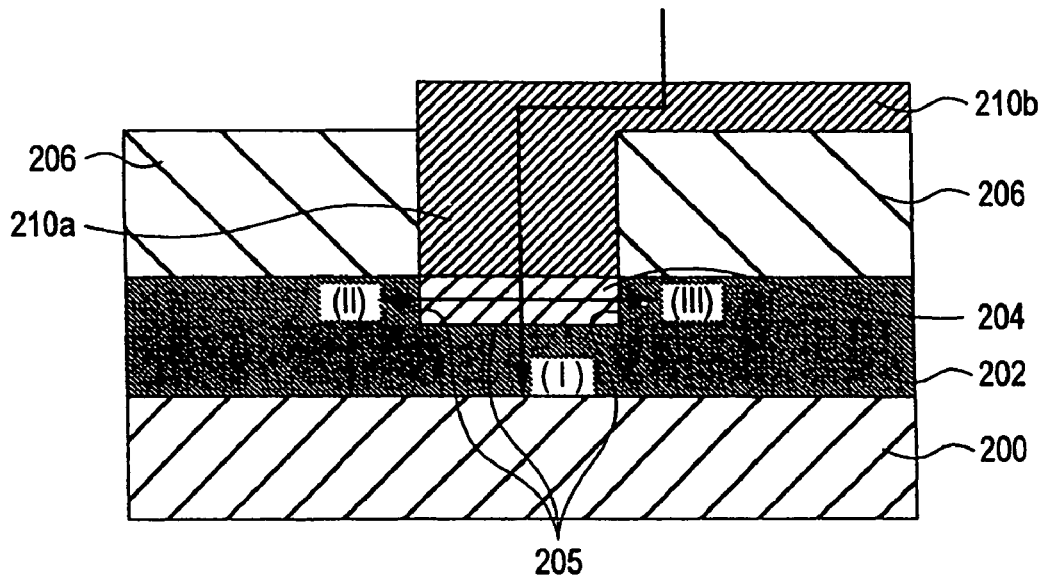
FIG. 4 is a drawing for describing the conventional semiconductor device.
Figure 4B:
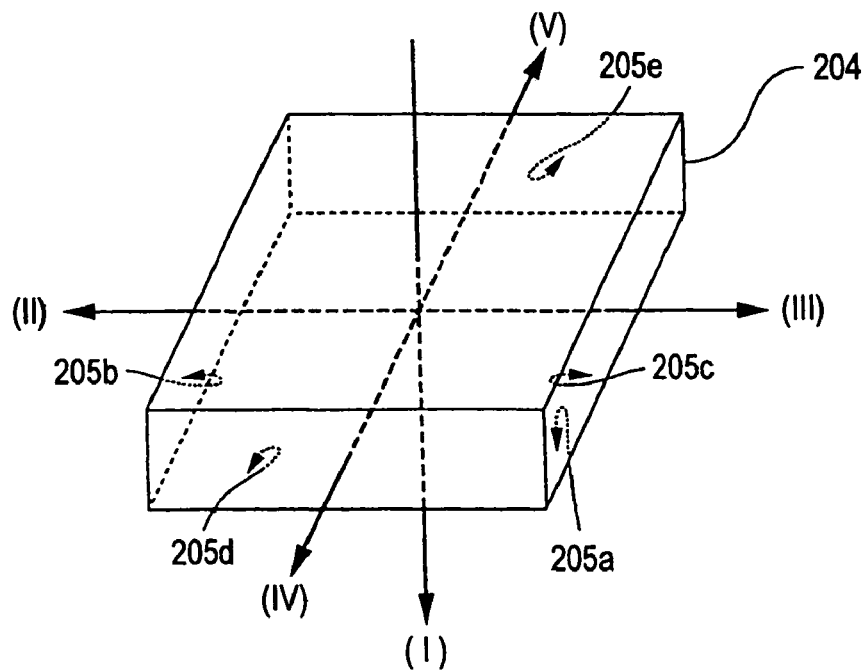
Figure 5A:
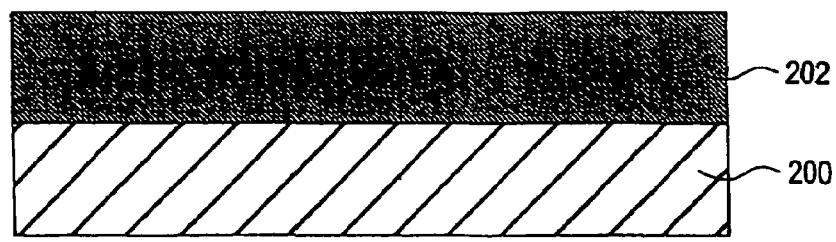
FIGS. 5A to 5D are process drawings for describing a method for producing the conventional semiconductor device.
Figure 5B:
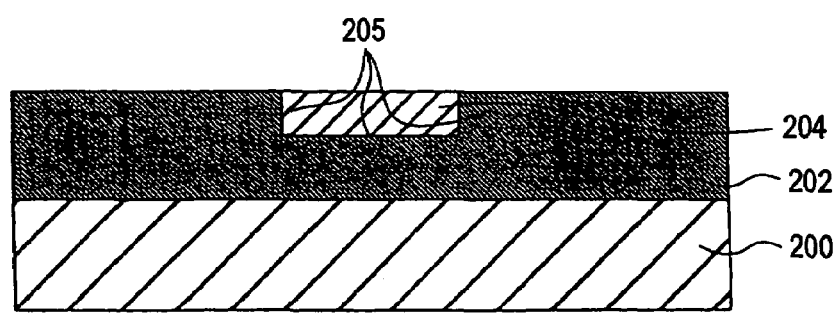
Figure 5C:
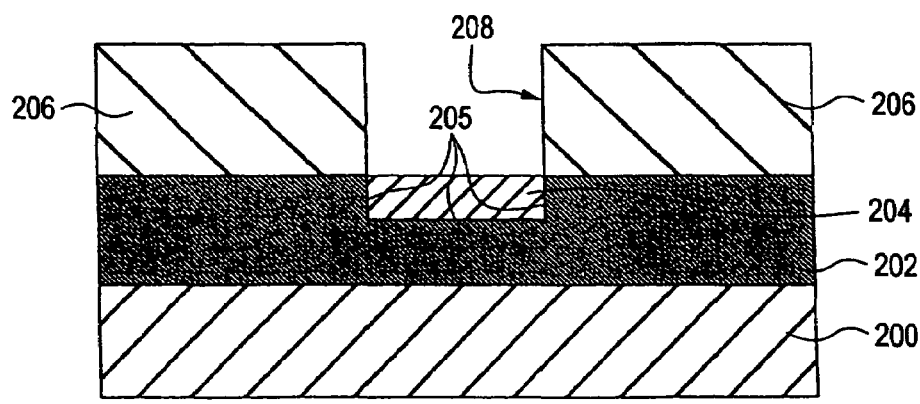
Figure 5D:
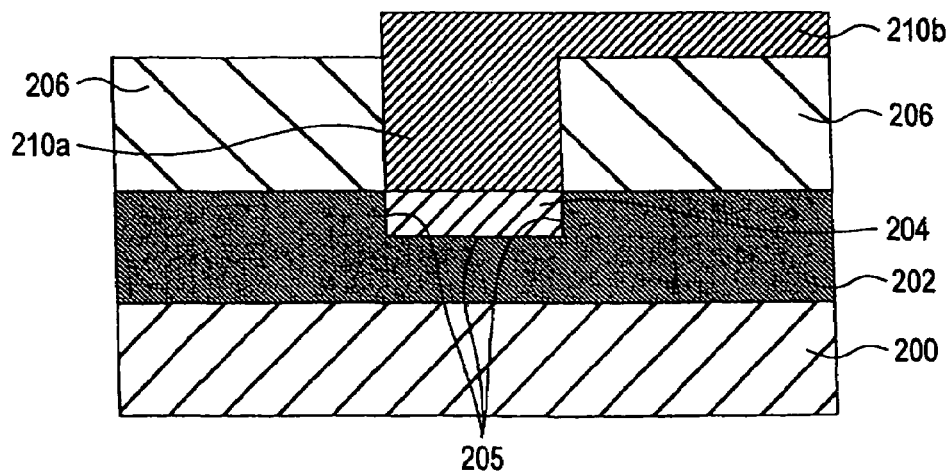

In this way, the configuration shown in FIG. 1B is in just a structure where in the example of the conventional configuration shown in FIG. 4A, the Si substrate 200 is omitted, the $N^+$ region 202 is replaced with the Si substrate 100, the $P^+$ region 204 is replaced with the $N^+$ region 102, and the conductive plug 210a is replaced with the PN junction plug portion 108a.

In the best mode, an area of the upper surface 103 of the $N^+$ region is equal to an area of a bottom 107 of the $P^+$ polysilicon plug, and the upper surface and the bottom surface have the same profile. However, in the invention, it is sufficient that the PN junction is formed by forming the $P^+$ polysilicon plug 109 on the upper surface 103 of the $N^+$ region, and the invention can be used even in the case that the bottom 107 of the $P^+$ polysilicon plug is larger or smaller than the upper surface 103 of the $N^+$ region. Therefore, when the bottom area of the $P^+$ polysilicon plug 109 is formed equally to the area of the PN junction 205 on the $P^+$ region 204 parallel to the main surface of the Si substrate 200 shown in FIG. 4A, the structure is made to be such a structure that the $P^+$ polysilicon plug 109 is formed on such $N^+$ region 102, thereby the area of the PN junction is only the area of the bottom 107 of the $P^+$ polysilicon plug 109, therefore, since the area of the PN junction on the sides in the conventional structure is eliminated, the leakage current can be reduced. Moreover, as shown by arrows in FIGS. 1A and 1B, the charge-up current generated in the plasma treatment such as sputtering or dry etching in the formation of the wiring can be controlled to flow one-way rather than in many directions as in the conventional PN junction.

The best mode production method of the semiconductor device for practicing the invention is described with reference to FIGS. 2A-2E and FIGS. 3A-3C.

Figure 2A:
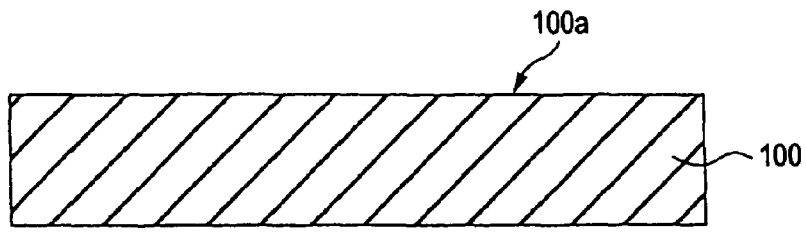
FIGS. 2A to 2E are process drawings for describing a method for producing the example of the configuration of the best mode semiconductor device respectively.
Figure 2B:
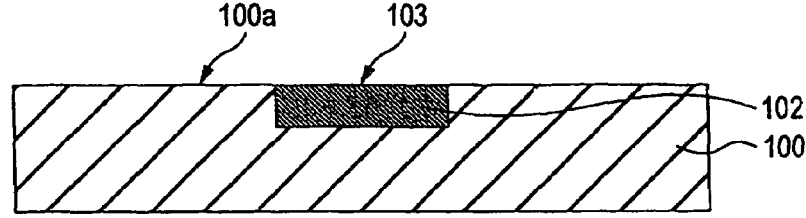

First, the Si substrate 100 is prepared (FIG. 2A). A resist pattern in which a region for forming the $N^+$ region 102 is opened is formed on the main surface of the Si substrate 100 (not shown). The N-type impurity is ion-implanted into the main surface 100a of the Si substrate 100 and then the resist pattern is removed, thereby the $N^+$ region 102 is formed from that main surface to an inside portion of the Si substrate 100 (FIG. 2B).

Figure 2C:
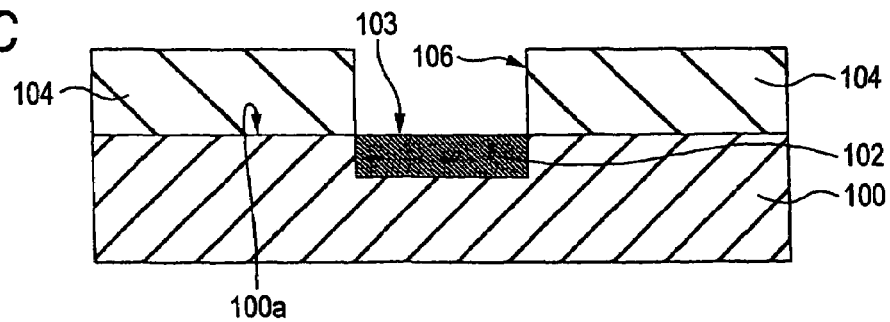
Figure 2D:
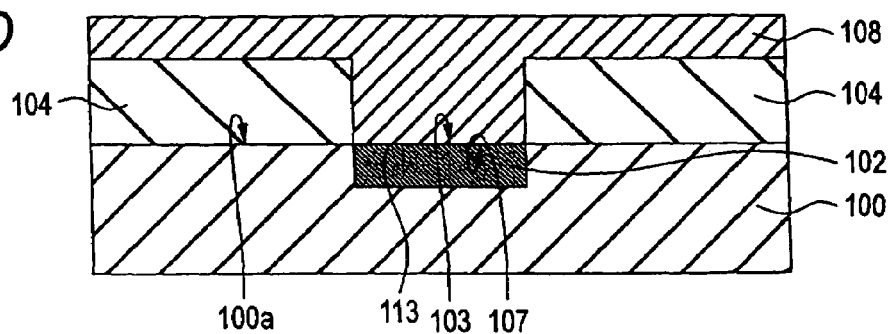

Next, the insulating film 104 is deposited with a silicon oxide film by, for example, CVD method. Then, a region of the insulating film portion in an upside of the $N^+$ region 102 is opened by a known photolithography etching technique, thereby an opening 106 is formed (FIG. 2C).

Next, a $P^+$ polysilicon film 108 is formed, for example, by depositing a polysilicon film doped with the P-type impurity by the CVD method (FIG. 2D) The region where the $N^+$ region 102 is contacted with the $P^+$ polysilicon film 108 is a PN junction 113. The $P^+$ polysilicon film 108 can be formed by depositing an undoped polysilicon film and then performing the ion implantation of the P-type impurity.

Figure 2E:
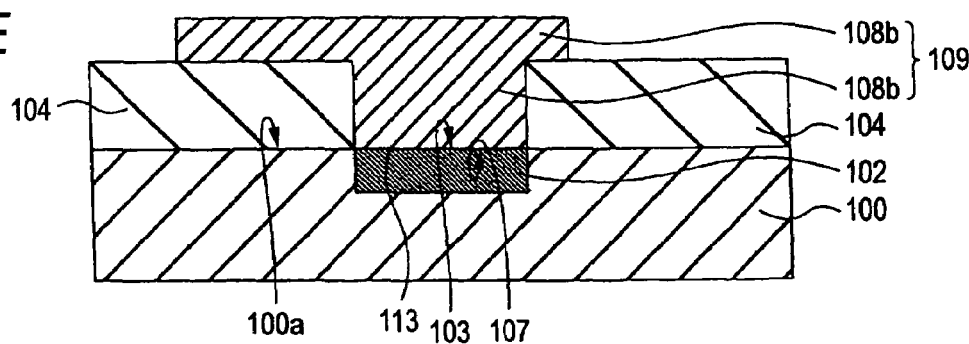

The formed $P^+$ polysilicon film 108 is patterned by the known photolithography etching technique, thereby the $P^+$ polysilicon plug 109 comprising the PN junction plug portion 108a and the wiring connection portion 108b is formed (FIG. 2E).

Figure 3A:
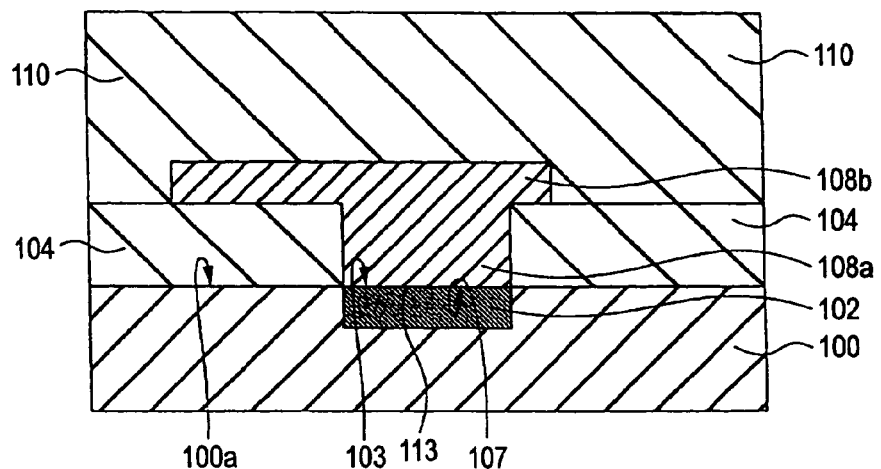
FIGS. 3A to 3C are process drawings continued from the process of FIG. 2E.
Figure 3B:
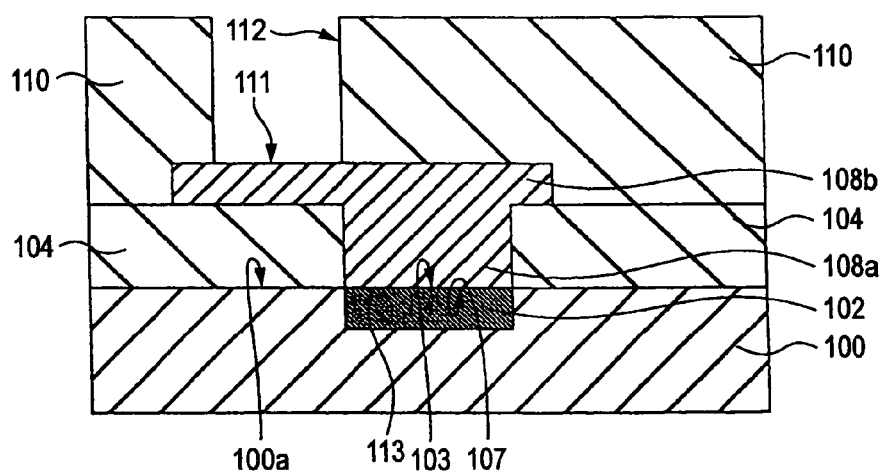

Next, the insulating film 110 is formed, for example, by depositing the silicon oxide film by the CVD method (FIG. 3A) Then, an opening 112 for exposing the top 111 of the $P^+$ polysilicon plug 109 is formed by the known photolithography etching technique (FIG. 3B).

Figure 3C:
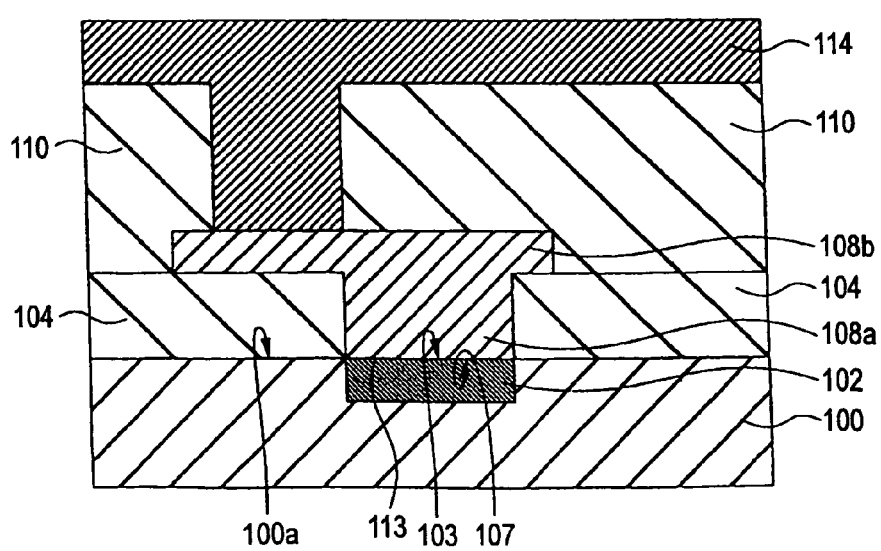

The conductive layer 114 is formed, for example, by the sputtering with aluminum (FIG. 3C). Then, the layer is patterned by the known photolithography etching technique, thereby the semiconductor device shown in FIG. 1 is formed.

Here, impurity densities of the $N^+$ region 102 and the $P^+$ polysilicon plug 109 are set to be equal to each other. This is preferable for the PN junction diode used in a site where the rectification of the electric current is required. The range where the impurity densities are considered to be the same is determined to be a range where the impurity densities of the $N^+$ region 102 and the $P^+$ polysilicon plug 109 are the same, or slightly different in such a degree that the Zener diode is not formed. For example, when the density of the N-type impurity in the $N^+$ region 102 is about $1.0 \times 10^{15}$ cm$^{-2}$, the density of the P-type impurity in the $P^+$ polysilicon plug 109 can be in order of $5.0 \times 10^{14}$ cm$^{-2}$ to $5.0 \times 10^{15}$ cm$^{-2}$.

Although an example that the $P^+$ polysilicon plug is formed in the $N^+$ region is shown in the best mode, similar effects are obtained from a PN junction diode in which the first conductive type and the second conductive type are formed reversely, or an N+ polysilicon plug is formed in a P+ region.

What is claimed is:

1. A semiconductor device comprising:
    a silicon substrate,
    a first conductive type impurity region provided in the silicon substrate, the first conductive type impurity region having an upper surface being exposed at one main surface of the silicon substrate,
    a second conductive type polysilicon plug provided in connection with the upper surface of the first conductive type impurity region to form a PN junction, and
    a wiring connected to a top of the second conductive type polysilicon plug,
    wherein an impurity density of the first conductive type impurity region is a value of $1.0 \times 10^{15}$ cm$^{-2}$ and an impurity density of the second conductive type polysilicon plug is a value within a range of $5.0 \times 10^{14}$ cm$^{-2}$ to $5.0 \times 10^{15}$ cm$^{-2}$.

2. The semiconductor device according to claim 1, wherein the impurity density of the first conductive type impurity region is equal to the impurity density of the second conductive type polysilicon plug.

3. The semiconductor device according to claim 1, wherein an upper surface of the silicon substrate and the upper surface of the first conductive type impurity region are along a same plane.

4. The semiconductor device according to claim 1, wherein the second conductive type polysilicon plug has a PN junction plug portion forming the PN junction with the first conductive type impurity region, and a wiring connection portion formed continuously and integrally with the PN junction plug portion and connected to the wiring.

5. The semiconductor device according to claim 1, wherein the second conductive type polysilicon plug has a PN junction plug portion forming the PN junction with the first conductive type impurity region and is connected to the wiring.

6. The semiconductor device according to claim 1, wherein each of the upper surface of the first conductive type impurity region and a bottom of the second conductive type polysilicon plug has a same profile.

7. The semiconductor device according to claim 1, wherein the PN junction is formed only along one planar surface.

8. The semiconductor device according to claim 1, wherein the first conductive type is N conductive type and the second conductive type is P conductive type.

9. The semiconductor device according to claim 1, wherein the first conductive type is P conductive type and the second conductive type is N conductive type.

10. A semiconductor device comprising:
    a silicon substrate;
    an impurity region of a first conductivity type formed in the silicon substrate, the impurity region having only an upper surface thereof exposed from the silicon substrate;
    a first insulating film formed on the silicon substrate, the first insulating film including a first opening over the upper surface of the impurity region;
    a polysilicon plug of a second conductivity type formed in the first opening in contact with the impurity region and on an upper surface of the first insulating film;
    a second insulating film formed on an upper surface of the polysilicon plug and on the upper surface of the first insulating film, the second insulating film having a second opening over the polysilicon plug; and
    a conductive wiring layer formed in the second opening in contact with the polysilicon plug and on an upper surface of the second insulating film,
    wherein an impurity concentration of the impurity region is substantially $1.0 \times 10^{15}$ cm$^{-2}$, and an impurity concentration of the polysilicon plug is within a range of $5.0 \times 10^{14}$ cm$^{-2}$ to $5.0 \times 10^{15}$ cm$^{-2}$.

11. A semiconductor device comprising:
    a silicon substrate;
    an impurity region of a first conductivity type formed in the silicon substrate, the impurity region having only an upper surface thereof exposed from the silicon substrate;
    a first insulating film formed on the silicon substrate, the first insulating film including a first opening over the upper surface of the impurity region;
    a polysilicon plug of a second conductivity type formed in the first opening in contact with the impurity region;
    a second insulating film formed on an upper surface of the first insulating film, the second insulating film having a second opening over the polysilicon plug; and
    a conductive wiring layer formed in the second opening in contact with the polysilicon plug and on an upper surface of the second insulating film,
    wherein an impurity concentration of the impurity region is substantially $1.0 \times 10^{15}$ cm$^{-2}$, and an impurity concentration of the polysilicon plug is within a range of $5.0 \times 10^{14}$ cm$^{-2}$ to $5.0 \times 10^{15}$ cm$^{-2}$.

12. The semiconductor device according to claim 11, wherein the conductive wiring layer is aluminum.

13. The semiconductor device according to claim 11, wherein a surface area of the upper surface of the impurity region is substantially equal to a cross-sectional area of the first opening and a cross-sectional area of the second opening.

14. The semiconductor device according to claim 11, wherein an impurity concentration of the impurity region is substantially equal to an impurity concentration of the polysilicon plug.

* * * * *